(12) United States Patent
Kugel et al.

(10) Patent No.: US 10,249,596 B1
(45) Date of Patent: Apr. 2, 2019

(54) FAN-OUT IN BALL GRID ARRAY (BGA) PACKAGE

(71) Applicant: Juniper Networks, Inc., Sunnyvale, CA (US)

(72) Inventors: Valery Kugel, Mountain View, CA (US); Bhavesh Patel, Fremont, CA (US); Pradeep Sindhu, Los Altos Hills, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/198,253

(22) Filed: Jun. 30, 2016

(51) Int. Cl.
*H01L 25/065* (2006.01)
*H01L 23/498* (2006.01)
*H05K 1/18* (2006.01)
*H01L 23/00* (2006.01)
*H01L 25/00* (2006.01)
*H01L 21/48* (2006.01)

(52) U.S. Cl.
CPC ...... *H01L 25/0655* (2013.01); *H01L 21/4853* (2013.01); *H01L 23/49833* (2013.01); *H01L 23/49838* (2013.01); *H01L 23/49894* (2013.01); *H01L 24/17* (2013.01); *H01L 24/81* (2013.01); *H01L 25/50* (2013.01); *H05K 1/181* (2013.01); *H01L 2224/13147* (2013.01); *H01L 2224/1601* (2013.01); *H01L 2224/16227* (2013.01); *H01L 2224/1713* (2013.01); *H01L 2924/0665* (2013.01); *H01L 2924/14* (2013.01); *H01L 2924/1433* (2013.01);
(Continued)

(58) Field of Classification Search
CPC ..... H01L 21/4853; H01L 24/81; H01L 25/50; H01L 23/49894; H01L 24/17; H01L 23/49838; H01L 23/49833; H01L 25/0655; H01L 23/49816; H01L 2924/15311; H01L 2924/15321; H01L 2924/15331
See application file for complete search history.

(56) References Cited

U.S. PATENT DOCUMENTS

2007/0018303 A1   1/2007   Lee
2014/0104935 A1*  4/2014   Ware .................. G11C 7/1021
                                                           365/154
(Continued)

OTHER PUBLICATIONS

Guenin, "When Moore is Less: Exploring the 3rd Dimension in IC Packaging," www.electronics-cooling.com, Feb. 1, 2009, 5 pp.
(Continued)

*Primary Examiner* — Thanh Y Tran
(74) *Attorney, Agent, or Firm* — Shumaker & Sieffert, P.A.

(57) ABSTRACT

In some examples, a device includes at least two integrated circuits (ICs) and a first multi-chip module (MCM) substrate coupled to the at least two ICs, the first MCM substrate comprising a first ball grid array (BGA), wherein the first BGA comprises a first pitch indicative of a distance between balls of the first BGA. The device further includes a second MCM substrate coupled to the first MCM substrate with the first BGA, the second MCM substrate comprising a second BGA, wherein the second BGA comprises a second pitch indicative of a distance between balls of the second BGA, and wherein the second pitch is greater than the first pitch. The device further includes a printed circuit board (PCB) coupled to the second MCM substrate with the second BGA, wherein the first MCM substrate and the second MCM substrate comprise organic, non-silicon insulating material.

20 Claims, 5 Drawing Sheets

(52) U.S. Cl.
CPC ............. *H01L 2924/1579* (2013.01); *H01L 2924/15311* (2013.01); *H01L 2924/15788* (2013.01); *H01L 2924/2075* (2013.01); *H01L 2924/2076* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01); *H01L 2924/20756* (2013.01); *H01L 2924/20757* (2013.01); *H01L 2924/20758* (2013.01); *H01L 2924/20759* (2013.01); *H05K 2201/10734* (2013.01)

(56) References Cited

U.S. PATENT DOCUMENTS

2014/0367854 A1* 12/2014 Zhao ................. H01L 23/3142
257/738

2015/0255434 A1* 9/2015 Yazdani ................ H01L 21/486
257/737
2015/0279431 A1* 10/2015 Li ........................ H01L 25/50
365/51

OTHER PUBLICATIONS

Happich, "Developing and Strengthening 3D IC Manufacture in Europe," Electronics EETimes, Mar. 1, 2013, 21 pp.
Johnson, "3D Memory Chips May Beat 3D Hybrid Memory Cube," EE Times, Sep. 30, 2015, 3 pp.
Maxfield, "2D vs. 2.5D vs. 3D ICs 101," EE Times, Apr. 8, 2014, 7 pp.
Ruhmer, "Lithography Challenges for 2.5D Interposer Manufacturing," 3D InCites, Sep. 4, 2014, 4 pp.
Bagen et al., "Advanced Organic Substrate Technologies to Enable Electronics Miniaturization," Endicott Interconnect Technologies, Inc., Feb. 13, 2013, 35 pp.
"Solder Ball," Wikipedia, the free encyclopedia, retrieved from https://en.wikipedia.org/wiki/Solder_ball, May 22, 2016, 2 pp.

* cited by examiner

FAN-OUT IN BALL GRID ARRAY (BGA) PACKAGE

TECHNICAL FIELD

This disclosure relates to semiconductor packaging design and fabrication.

BACKGROUND

A ball grid array (BGA) is a set of conducting bumps on an insulating substrate. Each ball in the BGA may be an isolated electrical connection to a circuit node in an integrated circuit (IC) that is attached to the insulating substrate. The IC may rest on an opposite side of the insulating substrate from the BGA, with one or more balls of the BGA connecting to various nodes on the IC. The balls in the BGA may be spaced in a grid array, with each row and column separated by a distance known as a pitch.

SUMMARY

This disclosure describes a structure for a chip package, where the chip package interconnects to a printed circuit board (PCB) using a ball grid array (BGA). The structure within the chip package includes multiple organic, non-silicon insulating substrates. A first substrate includes a BGA that couples to a second substrate, and the second substrate includes a BGA for coupling to PCB. The pitch of the BGAs for the second substrate is larger than the pitch of the first substrate. By having different pitches in BGAs of the first and second substrates, a plurality of integrated circuits (ICs) can be coupled to the first substrate having the smaller pitch allowing for tight, compact placement of the ICs, and the inputs and outputs of the ICs can fan out on the PCB through the second substrate having the larger pitch.

Designing a PCB that is configured to couple to a chip package having a pitch that is similar in size as that of the second substrate allows for higher yield in the PCB as compared to a PCB that is designed to couple to a chip package having a pitch that is similar in size as that of the first substrate. However, coupling ICs directly on to the second substrate limits the number of ICs that can be placed because doing so may compromise mechanical integrity of the package while accommodating for the larger pitch. By stacking substrates having different pitches, as described in this disclosure, the number of ICs within the package can increase without impacting structural integrity of the chip package and/or the PCB.

In some examples, the disclosure describes a device including at least two ICs and a first multi-chip module (MCM) substrate coupled to the at least two ICs, the first MCM substrate comprising a first BGA, wherein the first BGA comprises a first pitch indicative of a distance between balls of the first BGA. The device further includes a second MCM substrate coupled to the first MCM substrate with the first BGA, the second MCM substrate comprising a second BGA, wherein the second BGA comprises a second pitch indicative of a distance between balls of the second BGA, and wherein the second pitch is greater than the first pitch. The device further includes a PCB coupled to the second MCM substrate with the second BGA, wherein the first MCM substrate and the second MCM substrate comprise organic, non-silicon insulating material.

In some examples, the disclosure describes a method including electrically coupling at least two ICs to a first MCM substrate comprising a first BGA, wherein the first BGA comprises a first pitch indicative of a distance between balls of the first BGA. The method further includes electrically coupling the first MCM substrate to a second MCM substrate comprising a second BGA. The second BGA comprises a second pitch indicative of a distance between balls of the second BGA, and the second pitch is greater than the first pitch. The second MCM substrate is configured to be electrically coupled to a printed circuit board (PCB), and the first MCM substrate and the second MCM substrate comprise organic, non-silicon insulating material.

In some examples, the disclosure describes a substrate for coupling electrical components, the substrate that includes organic, non-silicon insulating material and two or more electrically conductive paths through the organic, non-silicon insulating material. The substrate further includes a BGA on a bottom side of the substrate, the BGA comprising a plurality of balls for electrically coupling the substrate to a PCB, the plurality of balls comprises a first pitch indicative of a distance between the balls. The substrate further includes a plurality of BGA pads on a top side of the substrate, the plurality of BGA pads comprising a plurality of pads for electrically coupling the substrate to another substrate that couples to one or more ICs through corresponding BGAs or balls. The plurality of BGA pads includes a second pitch indicative of a distance between the pads, wherein the first pitch is greater than the second pitch.

The details of one or more examples are set forth in the accompanying drawings and the description below. Other features, objects, and advantages will be apparent from the description and drawings, and from the claims.

DETAILED DESCRIPTION

Figure 1:
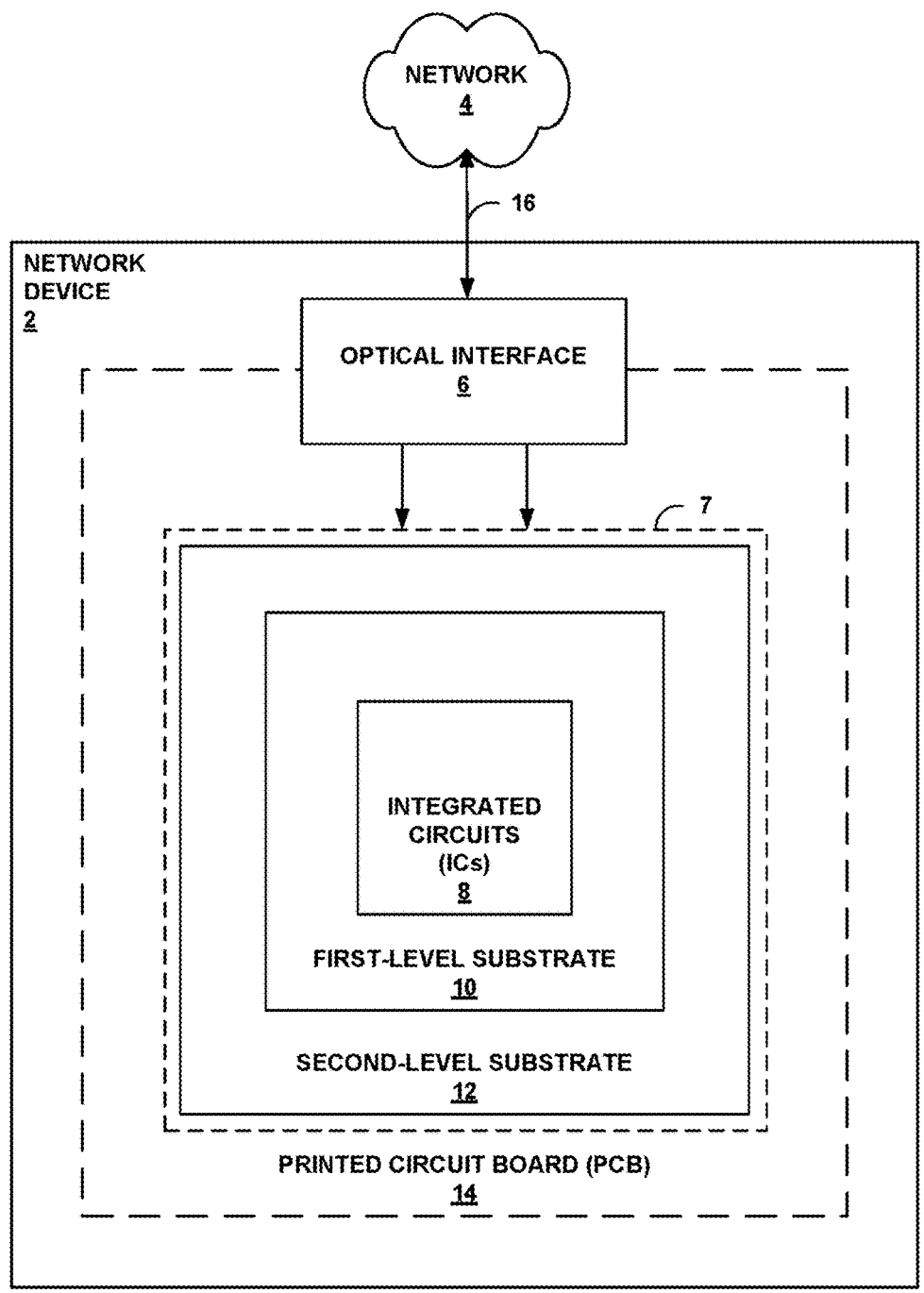
FIG. 1 is a is a block diagram illustrating a network device in an optical communication system, in some examples of this disclosure.

FIG. 1 is a block diagram illustrating a network device 2 in an optical communication system in accordance with one or more examples described in this disclosure. Network device 2 may include optical interface 6, which may be electrically coupled to multi-chip module (MCM) 7 and optically coupled to network 4. Network device 2 may be part of an optical communication system such as a wavelength-division multiplexing (WDM) system, including a dense wavelength division multiplexing (DWDM) system. Network device 2 may be a router, modem, or any other network device.

Network 4 may be any type of network that allows different devices to communicate with one another. For instance, examples of network 4 include, but are not limited to, a wide area network (WAN) or the Internet. Network 4 may be coupled to optical interface 6 of network device 2 by optical link 16.

Optical interface 6 may be a hardware interface that includes components for transmission and reception of optical data. Optical interface 6 may convert electrical data streams from MCM 7 to an optical signal for further transmission into network 4 via optical link 16. In the reverse, optical interface 6 may receive optical signals via optical link 16 from network 4, and may convert the optical signals to electrical data streams.

As illustrated, MCM 7 includes one or more integrated circuits (ICs) 8, first-level substrate 10, and second-level substrate 12. In some examples, MCM 7 may be referred to as a chip package or a package. One or more ICs 8 may be in die form and may be separate or combined electrical circuits formed on a single piece of semiconductor such as silicon, germanium, or gallium arsenide. Examples of ICs 8 include, but are not limited to, a digital signal processor (DSP), a general purpose microprocessor, an application specific integrated circuit (ASIC), a field programmable gate array (FPGA), a combination thereof, or other equivalent integrated or discrete logic circuitry.

For purposes of illustration, ICs 8 may be a serializer/deserializer (ser/des) attached to first-level substrate 10. A ser/des may translate parallel data streams to serial data streams and may translate serial data streams to parallel data streams. As an example, ICs 8 may include four ASICs, each ASIC forming one ser/des. For instance, one ASIC may serialize one hundred and twenty-eight inputs data lines into a single data output and/or deserialize one input data line into one hundred and twenty-eight output data lines. The above is one example of ICs 8 and should not be considered limiting.

In FIG. 1, optical interface 6 outputs data to MCM 7. One or more ICs 8 receive data from optical interface 6 through second-level substrate 12 and first-level substrate 10, as described in more detail below. One or more ICs 8 may deserialize the received data into a plurality of data streams, and output the data streams to a plurality of electronic components further downstream on PCB 14 through the first-level substrate and the second-level substrate. In the upstream direction, one or more ICs 8 receive data from a plurality of electronic components through second-level substrate 12 and first-level substrate 10, serialize the data into one data stream, and output the data stream to optical interface 6 through first-level substrate 10 and second-level substrate 12.

For example, in a WDM system, ICs 8 of network device 2 may receive electrical data streams from multiple devices such as switches or routers that one or more ICs 8 serialize together. In some examples, in addition to serializing, one or more ICs 8 may encode the received data streams utilizing any one of a variety of modulation schemes and may transmit the modulated data as electrical data streams to optical interface 6.

One or more ICs 8 may receive an electrical data stream from optical interface 6 and may demodulate the electrical data stream to generate demodulated electrical data stream prior to deserializing. ICs 8 may then deserialize the demodulated electrical data stream into a plurality of electrical data streams and may transmit each of the electrical data streams to other network devices or other ICs within network device 2.

The example illustrated in FIG. 1 is one type of optical system in which the techniques described in this disclosure may be implemented. In general the techniques described in this disclosure may be implemented in any type of electrical circuit system. For example, the techniques described in this disclosure may be used in digital computer systems, analog electronic systems, electrical power systems, or the like. Although optical systems are described, the techniques may be applicable to non-optical communication systems as well.

The speed of communication between ICs 8 in MCM 7 may be an important factor in the performance of MCM 7. MCM 7 may have higher-speed communication links between ICs 8 and between MCM 7 and other devices. First-level substrate 10 may facilitate faster communication between ICs 8 through relatively thick communication lines between ICs 8.

For instance, MCM 7 may be considered as being part of an electronic system, a data processing system, or a communication system. Electronics systems may use digital logic gates and/or analog components to transmit data, amplify signals, or modulate signals. ICs 8 may include one or more logic gates and/or analog components with terminals connected to input-output (IO) points on ICs 8. The input-output (IO) points on ICs 8 may be chip bumps with a pitch on the order of one hundred micrometers or two hundred micrometers. ICs 8 may use controlled collapse chip connection (C4), also known as flip-chip technology, to connect with first-level substrate 10.

First-level substrate 10 may be an MCM substrate that includes organic, non-silicon insulating material. First-level substrate 10 may also include conducting material formed as pads on the surface of first-level substrate 10. ICs 8 may attach to first-level substrate 10 such that the pads on first-level substrate 10 attaches to the IO points of ICs 8. The pads on first-level substrate 10 are coupled to a ball-grid array (BGA) on the opposite surface of first-level substrate 10 through vias. The BGA of first-level substrate 10 couples to pads on second-level substrate 12. In this way, the IO points of ICs 8 may be electrically coupled to a first ball-grid array (BGA) between first-level substrate 10 and second-level substrate 12. Examples of the vias through which the IO pads of ICs 8 may connect to the first BGA through first-level substrate 10 include through-organic substrate vias (TOSVs), such as laser-drilled vias, that extend through first-level substrate 10. Alternatively or additionally, the electrical connections between the IO points of ICs 8 may be any other suitable connection. The electrical connections between the IO points of ICs 8 may include conductive paths through the insulating material in first-level substrate 10 or across one or both sides of first-level substrate 10, or a combination of interior and exterior conductive paths.

The above examples describe first-level substrate 10 as including vias that couple pads on a first side (e.g., top side) of first-level substrate 10 to a BGA on a second side (e.g., bottom side) of first-level substrate 10. In some examples, first-level substrate 10 may include interior vias or horizontal conductive paths that couple IO points on different ICs 8 to one another providing a relatively high speed communication link between ICs 8.

In the example techniques described in this disclosure, the first BGA between first-level substrate 10 and second-level substrate 12 may have a first pitch indicative of the distance between balls of the first BGA. For example, the balls in the first BGA may be arranged as two-dimensional grid, and the pitch is indicative of a distance between any two balls. In a square grid (e.g., balls are equally spaced vertically and horizontally), there may be one pitch value. In a rectangular grid (e.g., vertical distance between balls is different than horizontal distance between balls), there may be two pitch values. For a more random configuration, there may be a plurality of pitch values. In the examples described in this disclosure, a square ball grid is assumed, but the techniques are applicable to other examples as well.

Each ball in the first BGA may be a separate connection from the IO points on ICs 8 to second-level substrate 12 or to other IO points on different ICs 8. The balls in a BGA of this disclosure may include a solder ball, a copper bump, or any other suitable conductive material. In some examples, substrates 10, 12 may have a land-grid array, pads, or any suitable connector instead of or in combination with BGA. A smaller pitch in the first BGA may mean a higher density of connections, thereby allowing greater fan-out for ICs 8. The fan-out of an output node may be the number of input nodes that the output node can feed or connect to. In some examples, ICs 8 may have a fifty-six gigabyte-per-second ser/des that requires approximately fifteen IO points in a first BGA on the side of first-level substrate 10 coupled to second-level substrate 12. If first-level substrate 10 is sixty-five millimeters by sixty-five millimeters with a pitch of one millimeter, the first BGA may have approximately four thousand balls. Thus, first-level substrate 10 may support up to approximately two hundred and fifty ser/des, either as individual ICs 8 or combined into one or more ICs 8, at a pitch of one millimeter.

By reducing the first pitch and increasing the density of connections in the first BGA, first-level substrate 10 may support more ser/des. However, forming first-level substrate 10 with BGA having a five hundred micrometers pitch directly on PCB 14 may result in low-yield for PCB 14. For instance, PCB 14 may not be able to support coupling to receptors on PCB 14 that are separated by five hundred micrometers. In the techniques described in this disclosure, second-level substrate 12 may include pads having the same pitch as that of the BGA of first-level substrate 10, and a second BGA on the other side having a larger pitch (i.e., approximately one millimeter) for coupling to PCB 14.

Second-level substrate 12 may be a MCM substrate that includes organic, non-silicon insulating material. Second-level substrate 12 may also include conducting material within the insulating material. First-level substrate 10 may attach to second-level substrate 12 such that the first BGA is electrically coupled to the conducting material in second-level substrate 12. The first BGA between first-level substrate 10 and second-level substrate 12 may be electrically coupled to a second BGA between second-level substrate 12 and printed circuit board (PCB) 14. The first BGA and the second BGA may connect through second-level substrate 12 by TOSVs or conductive paths that extend through second-level substrate 12 such as laser-drilled vias.

The second BGA may have a second pitch indicative of the distance between balls of the second BGA. Each ball in the second BGA may be a separate connection between the first BGA and PCB 14. The second pitch may be greater than the first pitch, meaning that the first BGA may have a higher density of connections than the second BGA. The balls of the second BGA may also have larger diameters than the balls of the first BGA.

PCB 14 may be a substrate that includes conducting material and insulating material. Second-level substrate 12 may attach to PCB 14 such that the second BGA is electrically coupled to the conducting material in PCB 14. The conducting material in PCB 14 may form signal traces that operate as wires conducting electricity between the second BGA and other points in PCB 14. In some examples, PCB 14 may include other substrates and components, such as additional ICs, not shown in FIG. 1.

Network device 2 may include more than one PCB 14, although FIG. 1 depicts a single PCB 14 in network device 2. PCB 14 may include more than one second-level substrate 12, and second-level substrate 12 may include more than one first-level substrate 10. Similarly, first-level substrate 10 may include more than one IC in ICs 8. By stacking more than one MCM substrate, network device 2 may increase fan-out for ICs 8, allowing more ICs 8 to fit on a PCB 14. A greater number of ICs 8 on PCB 14 may translate to greater computing power for network device 2.

In accordance with the techniques of this disclosure, a device may include at least two ICs 8, a first-level MCM substrate 10, a second-level MCM substrate 12, and a PCB 14. The first-level substrate 10 may be mounted to the second-level substrate 12 by a first BGA with a first pitch, and the second-level substrate 12 may be mounted to the PCB 14 by a second BGA with a second pitch. The first pitch may be smaller than the second pitch, thereby increasing the density of connections between the ICs 8 and the first-level MCM substrate 10. The ICs 8 may therefore have increased fan-out because of the higher density of connections with the first-level substrate 10. First-level substrate 10 may have smaller size because the balls in the first BGA may have a higher density. The higher density of balls in first BGA means that there may be a higher number of BGA balls nearby each node on ICs 8, as compared to a BGA with a higher pitch.

As semiconductor devices become smaller and more powerful, there is a general push for smaller ICs with higher density of IO points. To connect all of the IO points of an IC to a BGA, the pitch of the BGA may decrease to provide more connections in a given area. Reducing the pitch below one millimeter may create high aspect ratios for vias in a PCB to which an IC is mounted. An aspect ratio may be defined as the depth of a via divided by the diameter or width of the via. High aspect ratios in the PCB may significantly reduce the yield and performance of the PCB. Stacking MCM substrates and coupling ICs to the top MCM substrate may reduce aspect ratios and increase yield in the PCB and in the stacked MCM substrates.

Figure 2:
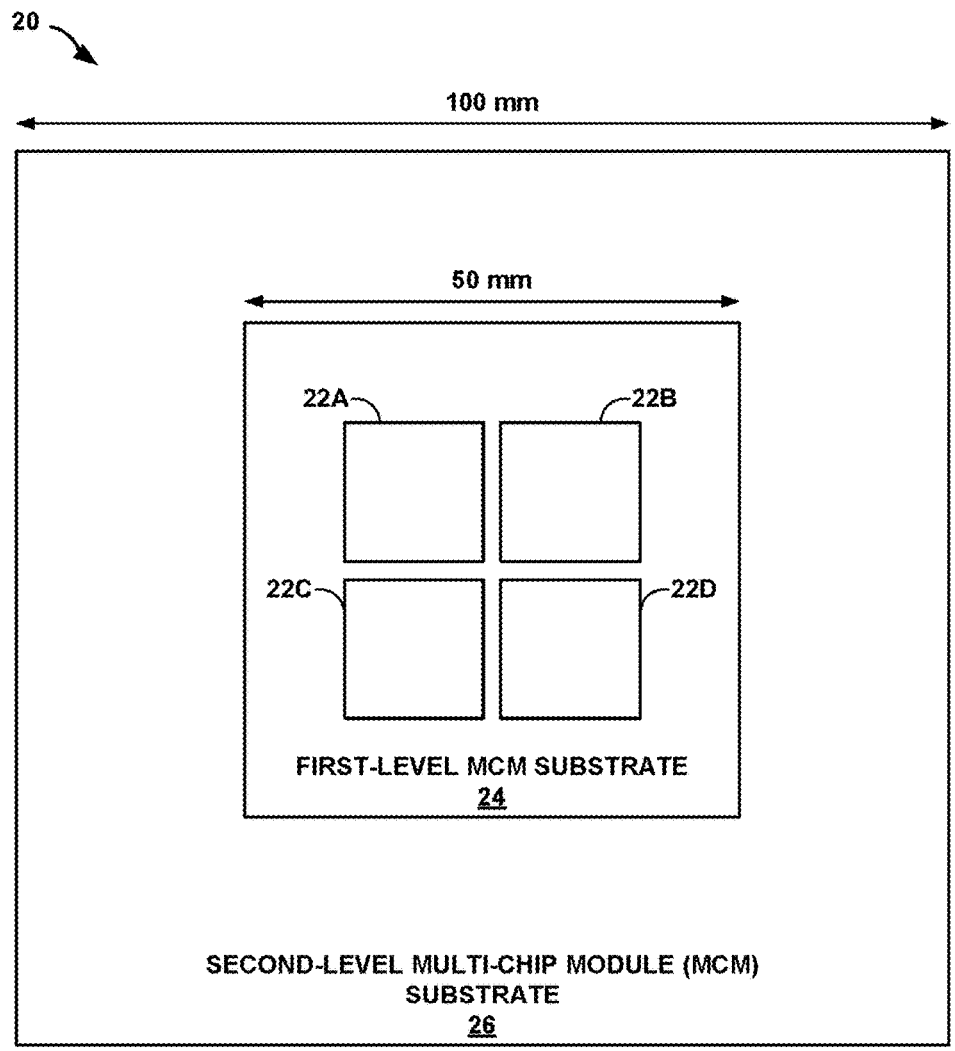
FIG. 2 is a block diagram illustrating four integrated circuit (ICs) coupled to multiple layers of multi-chip module (MCM) substrates, in some examples of this disclosure.

FIG. 2 is a block diagram illustrating four ICs 22A-22D coupled to multiple layers of MCM substrate 24, 26, in some examples of this disclosure. ICs 22 and MCM substrates 24, 26 may be inside package 20 such that only the second BGA attached to second-level 26 may be visible outside of package 20. Package 20 may be mounted to a PCB via the second BGA (not shown in FIG. 2).

Each of ICs 22 may be similar to IC 8 in FIG. 1. ICs 22 may be serializer-deserializer circuits used in network devices to communicate and process data. Each of ICs 22 may be electrically connected to other ICs of ICs 22 through communication links (not shown in FIG. 2) in first-level MCM substrate 24. Communication links in first-level MCM substrate 24 may allow ICs of ICs 22 to transmit and receive information with other ICs of ICs 22. Communication links in first-level MCM substrate 24 may also couple one or more of ICs 22 to second-level MCM substrate 26.

For faster communication between ICs 22, the spacing between ICs 22 may be reduced. This spacing may be measured, for example, between the adjacent sides of IC 22A and IC 22B. Closer spacing between ICs 22 may lead to shorter lengths of the communication links.

First-level MCM substrate 24 may be coupled to four ICs 22, as depicted in FIG. 2. TOSVs in first-level MCM substrate 24 and traces on first-level MCM substrate 24 may facilitate electrical connections between ICs 22. In some examples, first-level MCM substrate 24 may be coupled to as few as two ICs or more than four ICs. First-level MCM substrate 24 may be composed of organic, non-silicon insulating material such as epoxy resin. In some examples, first-level MCM substrate 24 may also contain glass.

As compared to a silicon interposer, first-level MCM substrate 24 may offer faster speeds for transmitting data between ICs 22. First-level MCM substrate 24 may have thicker metal (e.g., copper) communication lines than a silicon interposer. First-level MCM substrate 24 may also have a higher density of communication links without compromising yield, as compared to a silicon interposer. In some examples, first-level MCM substrate 24 may offer speeds in the tens of gigabytes per second, as compared to speeds of less than five gigabytes per second that silicon interposers may offer. Electrically conductive paths (e.g., wires) through first-level MCM substrate 24 may have larger thickness than electrically conductive paths through a silicon interposer. First-level MCM substrate 24 may also allow larger distances between ICs 22, as compared to a silicon interposer. ICs 22 may be spaced at five, ten, or more millimeters on first-level MCM substrate 24.

In addition, first-level MCM substrate 24 may be larger than a silicon interposer. In some examples, a silicon interposer between second-level MCM substrate 26 and ICs 22 may be twenty-six millimeters by thirty-two millimeters or less. To achieve a larger size, two silicon interposer may be connected for an interposer that is fifty-two millimeters by thirty-two millimeters. In contrast, as depicted in FIG. 2, first-level MCM substrate 24 may be fifty millimeters by fifty millimeters or larger.

First-level MCM substrate 24 may therefore be large enough to attach four or more ICs 22. Given the smaller pitch of first-level MCM substrate 24, first-level MCM substrate 24 may offer a high density of connections and communication links to ICs 22.

Second-level MCM substrate 26 may be coupled to first-level MCM substrate 24 to provide an electrical connection between first-level MCM substrate 24 and a PCB (not shown in FIG. 2). Second-level MCM substrate 26 may have a second BGA to facilitate connections between second-level MCM substrate 26 and a PCB. The pitch of the second BGA may be larger than the pitch of the first BGA to allow greater fan-out of the connections from ICs 22 through MCM substrates 24, 26 to PCB 26. Second-level substrate 24 may be one hundred millimeters by one hundred millimeters.

Figure 3:
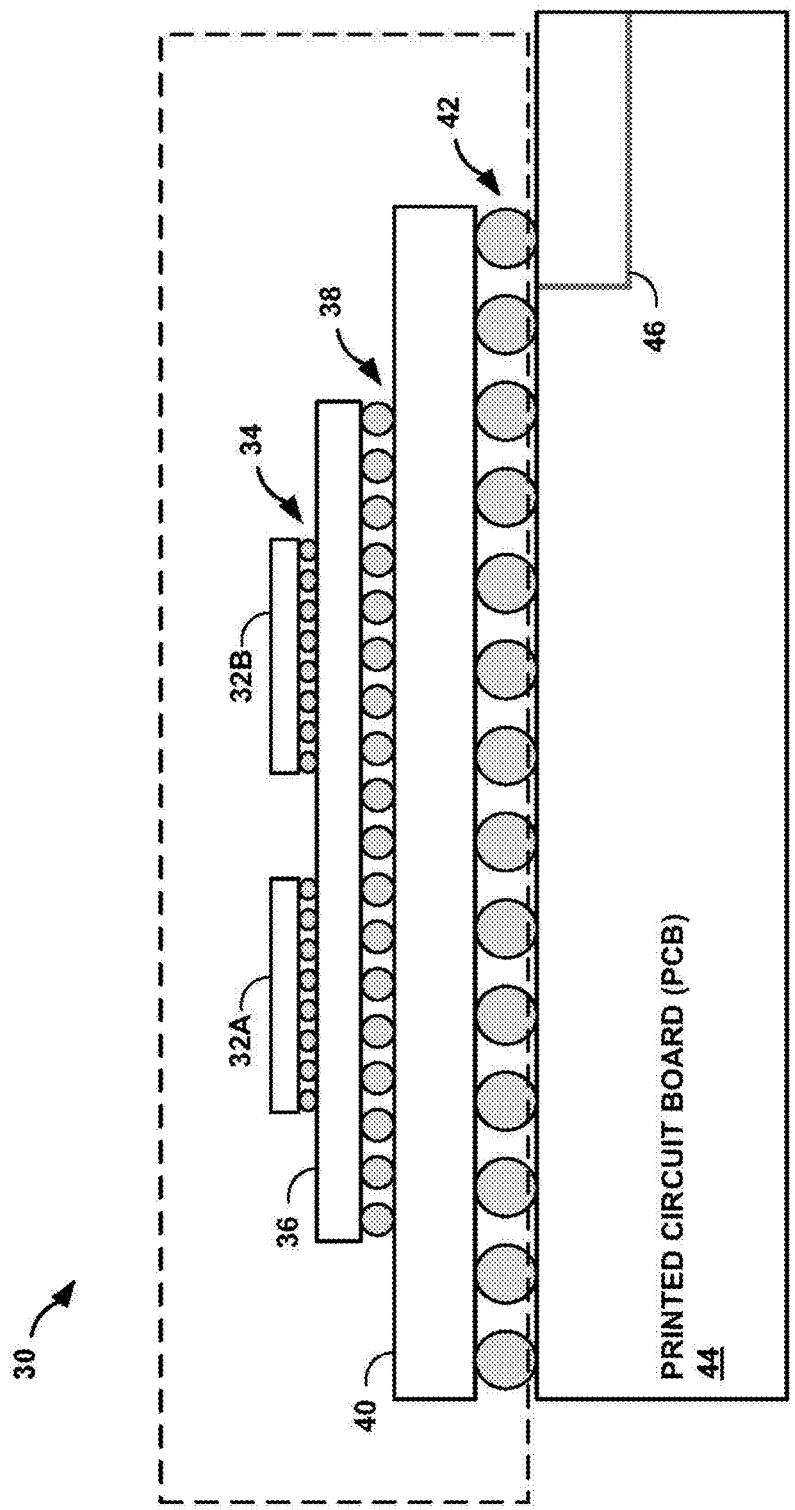
FIG. 3 is a block diagram illustrating two ICs coupled to multiple layers of MCM substrate, in some examples of this disclosure.

FIG. 3 is a block diagram illustrating two ICs 32A, 32B coupled to multiple layers of MCM substrate 36, 40, in some examples of this disclosure. Package 30 may include ICs 32, first-level MCM substrate 36, first BGA 38, second-level MCM substrate 40, and second BGA 42. Package 30 may attach to PCB 44 and may conduct electricity through traces 46 in PCB 44.

ICs 32 may be coupled to first-level MCM substrate 36 via chip bumps 34. In some examples, ICs 32 may include more than two ICs attached to first-level MCM substrate 36. Each of ICs 32 may have chip bumps, which FIG. 3 depicts as on bottom side of ICs 32. ICs 32 may employ flip-chip technology, also known as C4, which may use solder bumps or copper pillars to conduct electricity between one of ICs 32 and first-level MCM substrate 36. Chip bumps 34 may have a pitch that is smaller than the first pitch of first BGA 38 and the second pitch of second BGA 42. In some examples, the diameter of chip bumps 34 may be on the order of one hundred micrometers. The pitch of chip bumps 34 may also be on the order of one hundred micrometers or two hundred micrometers.

First-level MCM substrate 36 may facilitate electrical connections between chip bumps 34 and first BGA 38. First-level MCM substrate 36 may include conductive paths inside of or on either side of first-level MCM substrate 36. Conductive paths inside first-level MCM substrate 36 may include vertical paths, such as vias, or horizontal paths across first-level MCM substrate 36. First-level MCM substrate 36 may include TOSVs that are formed by laser drilling or preforming processes.

First BGA 38 may couple first-level MCM substrate 36 to second-level MCM substrate 40. First BGA 38 may have a first pitch on the order of five hundred micrometers. The first pitch may be indicative of the distance between balls in the first BGA.

Second-level MCM substrate 40 may facilitate electrical connections between first BGA 38 and second BGA 42. Second-level MCM substrate 40 may include conductive paths inside of or on either side of second-level MCM substrate 40. Conductive paths inside second-level MCM substrate 40 may include vertical paths, such as vias, or horizontal paths inside of or across the exterior of second-level MCM substrate 40. Second-level MCM substrate 40 may include TOSVs that are formed by laser drilling or pre-forming processes.

In some examples, package 30 may include a third MCM substrate (not shown in FIG. 3) coupled to second-level MCM substrate 40 by a third BGA with a third pitch. The third MCM substrate may be coupled to one or more additional ICs through chip bumps, similar to chip bumps 34. The third pitch may be less than the second pitch to allow fan-out of the additional ICs attached to the third MCM substrate. The third MCM substrate may operate in a similar manner to first-level MCM substrate 36.

Second BGA 42 may couple second-level MCM substrate 40 to PCB 44. Second BGA 42 may have a second pitch on the order of one millimeter. Second BGA 42 may connect to one or more traces 46 in PCB 44.

Figure 4B:
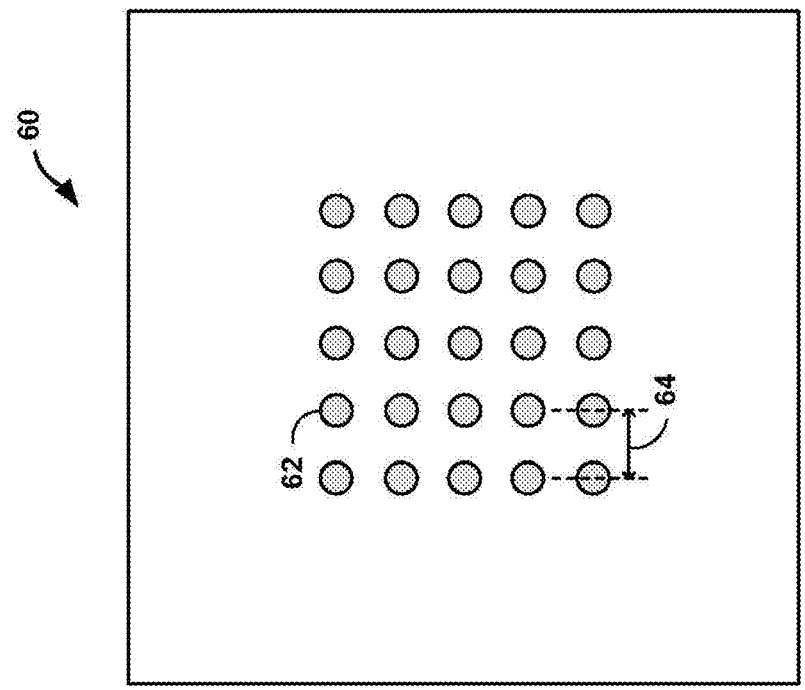
FIG. 4B is a block diagram illustrating a second side of an MCM substrate, in some examples of this disclosure.
Figure 4A:
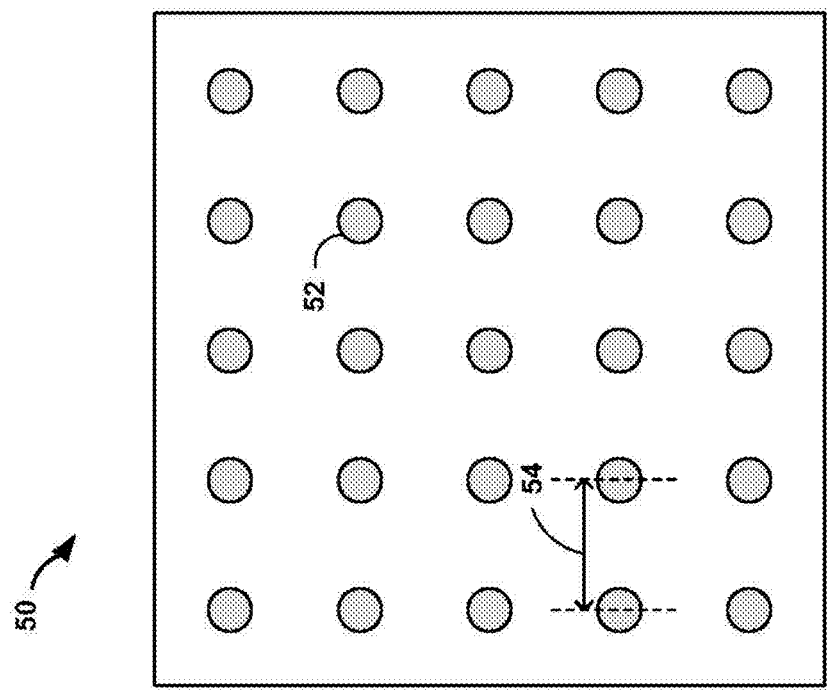
FIG. 4A is a block diagram illustrating a first side of a MCM substrate, in some examples of this disclosure.

FIG. 4A is a block diagram illustrating a first side 50 of a MCM substrate, in some examples of this disclosure. The MCM substrate may be composed of organic, non-silicon insulating material. First side 50 may include a BGA 52 and corresponding pads that includes at least two electrical connections. Each ball may be a solder bump, a copper pillar, or another suitable material for conducting electricity. Each ball in BGA 52 may be separated from an adjacent ball in BGA 52 by a distance known as pitch 54. BGA 52 may be electrically coupled to BGA pads 62 (see FIG. 4B) by two or more electrically conductive paths through organic, non-silicon insulating material.

FIG. 4B is a block diagram illustrating a second side 60 of an MCM substrate, in some examples of this disclosure. Second side 60 may include an array of BGA and corresponding pads 62 that includes at least two electrical connections. Each ball may be a solder bump, a copper pillar, or another suitable material for conducting electricity. Each pad in BGA 62 may be separated from an adjacent pad in the array of BGA pads 62 by spaces 64. Spaces 64 may correspond to the pitch of a BGA, or chip bumps, of an IC or another MCM substrate that may attach to the array of BGA pads 62.

Spaces 64 may be smaller than pitch 54 to allow for fan-out of the connections on second side 60. Fan-out from second side 60 to first side 50 may allow at each IC of at least two ICs (not shown in FIGS. 4A, 4B) to connect to other ICs and to connect to a PCB.

Figure 5:
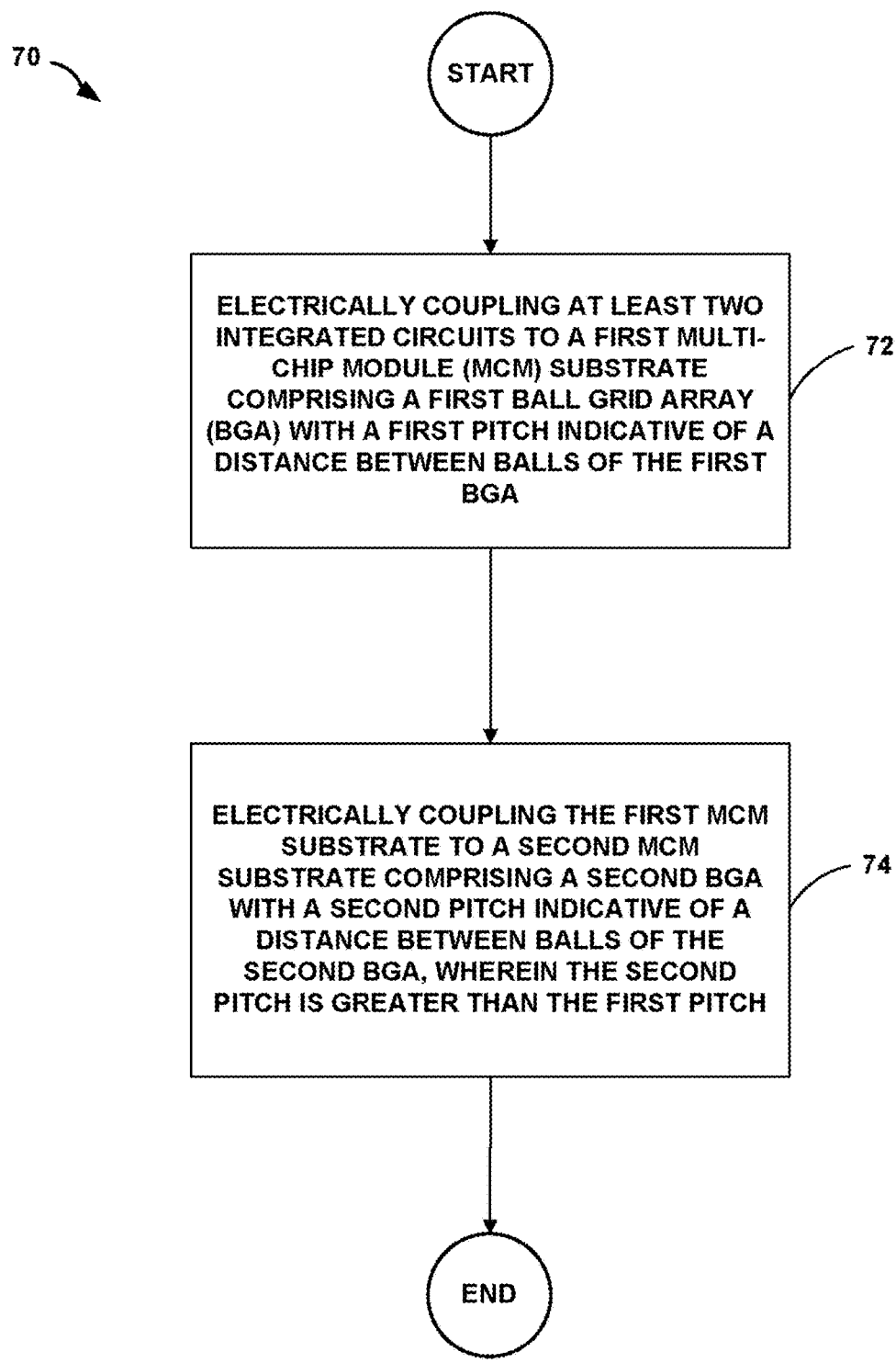
FIG. 5 is a flowchart illustrating an example process for fabricating an electronic device, in some examples of this disclosure.

FIG. 5 is a flowchart illustrating an example technique 70 for fabricating an electronic device, in some examples of this disclosure. Technique 70 is described with reference to the system of FIG. 3, including MCM substrates 36, 40, although other components, such as MCM substrates 24, 26 in FIG. 2 or substrates 10, 12 in FIG. 1, may exemplify similar techniques.

The technique of FIG. 5 includes electrically coupling at least two ICs 32 to first MCM substrate 36 comprising first BGA 38 (72). First BGA 38 comprises a first pitch that is indicative of a distance between balls of first BGA 38. ICs 32 may attach to first-level MCM substrate 36 by attaching chip bumps 34 to an array of pads on first-level MCM substrate 36. The pads on first-level MCM substrate 36 may connect each of ICs 32 to other ICs and to first BGA 38.

The technique of FIG. 5 further includes electrically coupling first-level MCM substrate 36 to second-level MCM substrate 40 comprising second BGA 42 (74). Second BGA 42 comprises a second pitch indicative of a distance between balls of the second BGA 42, where the second pitch is greater than the first pitch. Second-level MCM substrate 40 is configured to be electrically coupled to PCB 44, and MCM substrates 36, 40 comprise organic, non-silicon insulating material. The insulating material of MCM substrates 36, 40 may be epoxy resin or another suitable material that facilitates high-speed data transmission in MCM substrates. Connections through MCM substrates 36, 40 may include TOSVs, horizontal conductive paths inside and/or on the exterior of MCM substrates 36, 40.

Various examples have been described. These and other examples are within the scope of the following claims.

What is claimed is:

1. A device comprising:
    a set of at least four integrated circuits (ICs);
    a first multi-chip module (MCM) substrate comprising a communication link and a first ball grid array (BGA), wherein the first BGA comprises a first pitch indicative of a distance between balls of the first BGA, wherein each IC of the set of at least four ICs is coplanar mounted to a surface of the first MCM substrate, wherein the communication link couples a first IC of the set of at least four ICs to a second IC of the set of at least four ICs, and wherein the first MCM substrate comprises organic, non-silicon insulating material;
    a second MCM substrate coupled to the first MCM substrate with the first BGA, the second MCM substrate comprising a second BGA, wherein the second BGA comprises a second pitch indicative of a distance between balls of the second BGA, wherein the second pitch is greater than the first pitch, and wherein the second MCM substrate comprises organic, non-silicon insulating material; and
    a printed circuit board (PCB) coupled to the second MCM substrate with the second BGA.

2. The device of claim 1, wherein the first IC is configured to:
    transmit information to the second IC through the communication link; and
    receive information from the second IC through the communication link.

3. The device of claim 1, wherein:
    the communication link comprises a first communication link;
    the first MCM substrate comprises at least a second communication link that couples at least one of the first IC or the second IC to the second MCM substrate; and
    the at least one of the first IC or the second IC is configured to:
        transmit information to the second MCM substrate through the second communication link; and
        receive information from the second MCM substrate through the second communication link.

4. The device of claim 3,
    wherein the first IC is coupled to the second MCM substrate through the second communication link,
    wherein the first MCM substrate further comprises:
        a third communication link that couples the second IC to the second MCM substrate;
        a fourth communication link that couples a third IC of the set of at least four ICs to the second MCM substrate; and
        a fifth communication link that couples a fourth IC of the set of at least four ICs to the second MCM substrate.

5. The device of claim 1, wherein a distance between a side of the first IC and an adjacent side of the second IC is more than ten millimeters.

6. The device of claim 1, wherein each IC of the set of at least four ICs comprises a serializer-deserializer circuit.

7. The device of claim 1, wherein the second pitch is greater than or equal to one millimeter.

8. The device of claim 1, wherein the first pitch is less than or equal to five hundred micrometers.

9. The device of claim 1, wherein a width of the second MCM substrate is greater than sixty-five millimeters.

10. The device of claim 1, wherein a width of the first MCM substrate is less than sixty-five millimeters.

11. The device of claim 1,
    wherein each IC of the set of at least four ICs is coupled to the first MCM substrate by at least one bump; and
    wherein a diameter of the at least one bump is less than two hundred micrometers.

12. The device of claim 11, wherein the at least one bump comprises a copper pillar.

13. The device of claim 1, wherein the organic, non-silicon insulating material in the first MCM substrate and the organic, non-silicon insulating material in the second MCM substrate comprise epoxy resin and glass.

14. The device of claim 1, wherein:
    each IC of the set of at least four ICs includes a width of twenty millimeters, a length of twenty millimeters, and one-hundred and twenty-eight input-output contacts;
    the first MCM substrate includes a width of fifty millimeters, a length of fifty millimeters, a first set of communications links that couple the set of at least four ICs, and a second set of communications links that couple the set of at least four ICs to the second MCM substrate, wherein the first set of communications links includes the first communication link;
    the first pitch is five hundred micrometers;
    the second MCM substrate includes a width of one hundred millimeters and a length of one hundred millimeters; and
    the second pitch is one millimeter.

15. The device of claim 1, wherein each IC of the set of at least four ICs is coupled to at least two other ICs of the set of at least four ICs through a first set of communication links in the first MCM substrate, the first set of communication links including the first communication link.

16. A method comprising:
    electrically coupling a set of at least four integrated circuits (ICs) to a first multi-chip module (MCM) substrate comprising a communication link and a first ball grid array (BGA) at least in part by coplanar mounting each IC of the set of at least four ICs to a surface of the first MCM substrate, wherein the first BGA comprises a first pitch indicative of a distance between balls of the first BGA;

electrically coupling a first IC of the set of at least four ICs to a second IC of the set of at least four ICs through the communication link; and electrically coupling the first MCM substrate to a second MCM substrate comprising a second BGA, wherein:
the second BGA comprises a second pitch indicative of a distance between balls of the second BGA,
the second pitch is greater than the first pitch,
the second MCM substrate is configured to be electrically coupled to a printed circuit board (PCB), and
the first MCM substrate and the second MCM substrate comprise organic, non-silicon insulating material.

17. The method of claim 16, wherein:
a pitch of the second BGA is greater than or equal to one millimeter, and
a pitch of the first BGA is less than five hundred micrometers.

18. The method of claim 16, wherein the organic, non-silicon insulating material in the first MCM substrate and the organic, non-silicon insulating material in the second MCM substrate comprise epoxy resin and glass.

19. The method of claim 16, wherein electrically coupling the first IC to the second IC comprises:
electrically coupling the first IC to the communication link; and
electrically coupling the second IC to the communication link such that the first IC transmits information to and receives information from the second IC through the communication link.

20. A device comprising:
a first multi-chip module (MCM) substrate comprising:
first, second, third, fourth, fifth, sixth, seventh, and eighth communication links;
a first ball grid array (BGA) comprising a first pitch indicative of a distance between balls of the first BGA; and
organic, non-silicon insulating material;
a second MCM substrate coupled to the first MCM substrate with the first BGA, the second MCM substrate comprising a second BGA and organic, non-silicon insulating material, wherein the second BGA comprises a second pitch indicative of a distance between balls of the second BGA, and wherein the second pitch is greater than the first pitch;
a first integrated circuit (IC) coupled to the second MCM substrate through the fifth communication link;
a second IC coupled to the first IC through the first communication link and coupled to the second MCM substrate through the sixth communication link;
a third IC coupled to the second IC through the second communication link and coupled to the second MCM substrate through the seventh communication link;
a fourth IC coupled to the third IC through the third communication link, coupled to the first IC through the fourth communication link, and coupled to the second MCM substrate through the eighth communication link,
wherein the first IC, the second IC, the third IC, and the fourth IC are coplanar mounted to a surface of the first MCM substrate; and
a printed circuit board (PCB) coupled to the second MCM substrate with the second BGA.

* * * * *